United States Patent [19]

Ko

[11] Patent Number: 5,817,577
[45] Date of Patent: Oct. 6, 1998

[54] GROUNDING METHOD FOR ELIMINATING PROCESS ANTENNA EFFECT

[75] Inventor: Joe Ko, Hsinchu City, Taiwan

[73] Assignee: United Microelectronics Corp., Hsinchu City, Taiwan

[21] Appl. No.: 746,068

[22] Filed: Nov. 5, 1996

[51] Int. Cl.[6] ................................................. H01L 21/443
[52] U.S. Cl. ......................... 438/694; 438/599; 438/612; 438/622; 438/710
[58] Field of Search ................................. 438/599, 612, 438/622, 710

[56] References Cited

U.S. PATENT DOCUMENTS 5,434,108  7/1995  Ko et al. ................................. 437/228

OTHER PUBLICATIONS

S. M. Sze, *VLSI Technology*, Ch. 5, Reactive Plasma Etching pp. 184–189, Ch. 6, Dielectric and Polysilicon Film Deposition, pp. 235–238, Ch. 9, Metallization pp. 386–391, McGraw–and Polysilicon Hill International Editions, 1988 Singapore.

*Primary Examiner*—Charles L. Bowers, Jr.
*Assistant Examiner*—T. Nguyen
*Attorney, Agent, or Firm*—Rabin & Champagne, P.C.

[57] ABSTRACT

A method for eliminating the antenna effect in the manufacture of an integrated circuit in a silicon substrate, wherein there are contact pad areas at the periphery of the integrated circuit and interconnection lines connecting the contact pad areas with the integrated circuit. This is achieved by grounding the contact pad areas to the silicon substrate; processing in a plasma environment that would normally produce electrical charge build-up at the gate oxide of the integrated circuit, but wherein the grounded contact pad areas eliminates the charge build-up; and disabling the grounding of the contact pad areas to retrieve the functioning of the integrated circuit.

6 Claims, 4 Drawing Sheets

GROUNDING METHOD FOR ELIMINATING PROCESS ANTENNA EFFECT

The present invention relates to the manufacture of highly dense integrated circuits, and more particularly to the elimination of electrostatic charge build-up at the device during manufacture in, for example, plasma etching or the like process steps.

In the manufacture of highly dense integrated circuits using Metal Oxide Semiconductor (MOS) technology with multiple metal layers, electrical charge may build up at the device gate oxide during plasma processing. The charge accumulates on floating polysilicon and metal layers electrically connected to the gate oxide. Interconnection metal lines act as an "antenna", amplifying the charging effect and leading to trapped charges at the gale oxide. These trapped charges can cause yield loss and reliability failures.

Workers in the field have verified this problem experimentally. It is found that the double metal layer technologies worsen the effect by the ratio of the antenna area to the gate oxide area. The worst degradation of gate oxide occurs during oxynitride deposition, however other plasma processing is also believed to lead to trapped charges at the gate oxide.

Referring now to FIGS. 1A and 1B, there are shown schematic diagrams of the prior art process for connecting a large contact pad with an active MOS device by using a metal layer, which could lead to device damage due to the antenna effect. As can be seen in FIG. 1A, in the manufacture of MOS semiconductor devices, a large contact pad area 10 (of typical size 100 by 100 micrometers, and more than about 30 by 30 micrometers) is electrically connected by vias 12 to a polysilicon interconnection 14. The pad area 10 in a double metal process would consist of two layers 24 and 26 of metal, as shown in FIG. 1B. The upper metal layer, or metal II, 26 is connected through an insulating layer 28 to the lower metal layer, or metal I, 24 by a large via 25 which is generally less than 5 micrometers of the large contact pad area 10. The polysilicon interconnection 14 is connected by vias 16 through an insulating layer to metal interconnection 18. This metal interconnection 18 is connected by vias 17 to polysilicon 20 to active devices 22. There is a direct electrical connection among all elements, and charge accumulated during plasma processing on the polysilicon and large metal areas can lead to damage to the devices due to trapped charges. More specifically, charge will be induced and accumulated on the exposed lower metal layer 24 through the large via 25 in the pre-sputter etching step before the upper metal layer 26 is sputtered. The induced charge can lead to damage to the devices 22 via the direct electrical connection path, from the lower metal layer 24, the polysilicon interconnection 14, the metal interconnection 18 to the polysilicon 20. In addition, the greater the size of the large via 25 is, the greater amount of the charge induced and accumulated.

It is common in the manufacture of integrated circuits today to use plasma etching, plasma enhanced chemical vapor deposition, and sputtering technologies. See *VLSI Technology*, S. M. Sze., Chapter 5—Reactive Plasma Etching pages 184–189, Chapter 6—Dielectric and Polysilicon Film Deposition pages 235–238, Chapter 9—Metallization pages 386–391, published by McGraw-Hill International Editions 1988 in Singapore. A plasma is a collection of charged particles, including electrons and positive and negative ions, and it is these charged particles that collect along the conductive surfaces during plasma processing and may produce the trapped charges damaging the gate oxide.

Therefore, the primary object of the present invention is to provide a grounding method for eliminating the antenna effect of accumulated electrical charge on floating polysilicon, metal interconnections, and contact pads connected to the gate oxide, without additional process steps. This is accomplished by grounding the large contact pad areas to a silicon substrate during plasma processing.

In accordance with the present invention, a method for eliminating the antenna effect in the manufacture of an integrated circuit in a silicon substrate, wherein there are contact pad areas at the periphery of the integrated circuit and interconnection lines connecting the contact pad areas with the integrated circuit, comprises:

(a) grounding the contact pad areas to the silicon substrate;

(b) processing in a plasma environment that would normally produce electrical charge build-up at the gate oxide of the integrated circuit, but wherein the grounded contact pad areas eliminate the charge build-up; and (c) disabling the grounding of the contact pad areas to retrieve the functioning of the integrated circuit.

In accordance with one aspect of the present invention, the step (a) includes the steps of:

forming a diffusion region in the silicon substrate;

forming an insulating layer on the silicon substrate with at least one opening to the diffusion region; and depositing and patterning a first layer of metal on the insulating layer to form the contact pad areas, the interconnection lines, a power rail connected to the diffusion region through the opening in the insulating layer, a power pad area connected to the power rail, and dummy lines respectively connecting the contact pad areas with the power rail, thereby grounding the contact pad areas to the silicon substrate via the dummy lines, power rail and diffusion region.

In accordance with one embodiment of the present invention, the step (c) includes the step of applying a predetermined voltage alternately across each one of the contact pad areas and the power pad area to burn out the dummy lines so that the contact pad areas are disconnected from the power rail.

In accordance with another embodiment of the present invention, the step (c) includes the steps of:

forming a second insulating layer on the first metal layer with openings to the contact pad areas and dummy lines;

depositing a second layer of metal on the second insulating layer such that the second metal layer is connected to the contact pad areas and dummy lines through the openings in the second insulating layer;

forming a resist material over the contact pad areas;

removing the uncovered second metal layer, and then removing the uncovered dummy lines in order to disconnect the contact pad areas from the power rail; and removing the resist material, thereby the residual second metal layer with the first metal layer in the contact pad areas forms the eventual contact pads of the integrated circuit.

In accordance with another aspect of the present invention, the processing in a plasma environment is plasma enhanced chemical vapor deposition, plasma etching, or sputter etch. The method of the present invention can be applied to multi-level metal technology in a similar way.

The present invention can be more fully understood by reference to the following description and accompanying drawings, which form an integral part of this application:

Figure 1A:
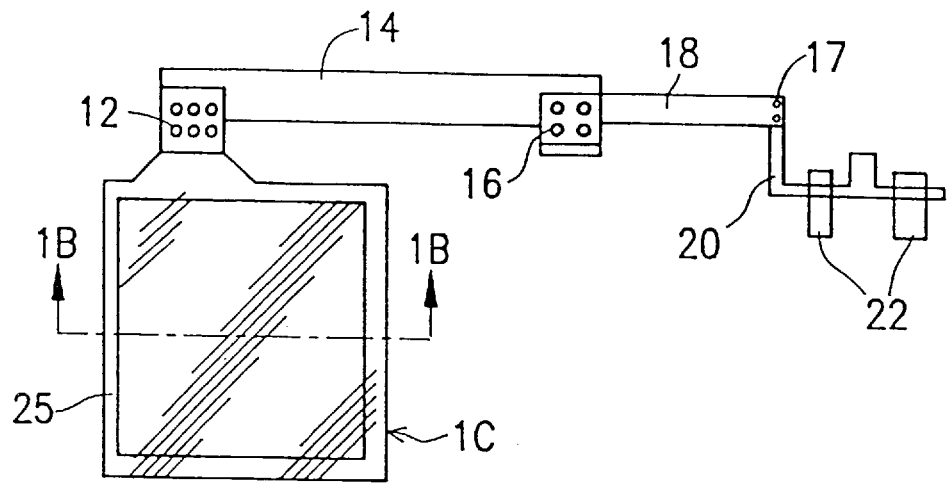
FIGS. 1A and 1B illustrate the Prior Art process for connecting a large contact pad with an active MOS device by using a metal layer, which could lead to device damage due to the antenna effect.
Figure 1B:
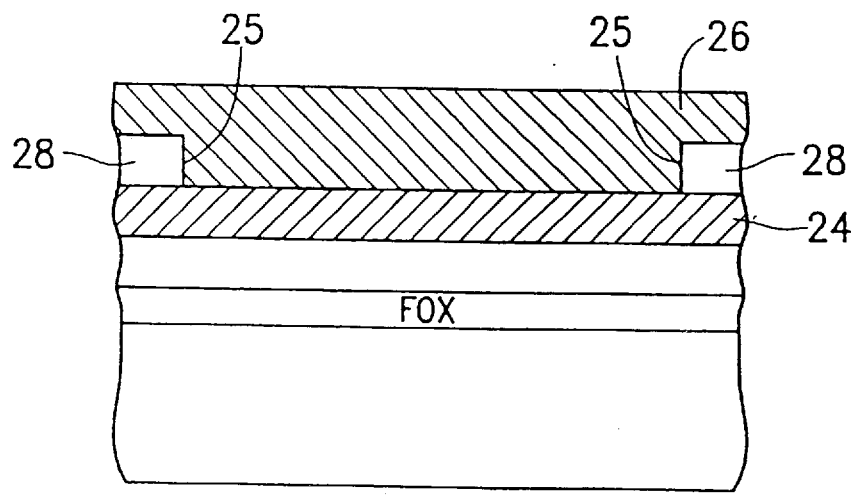
Figure 2:
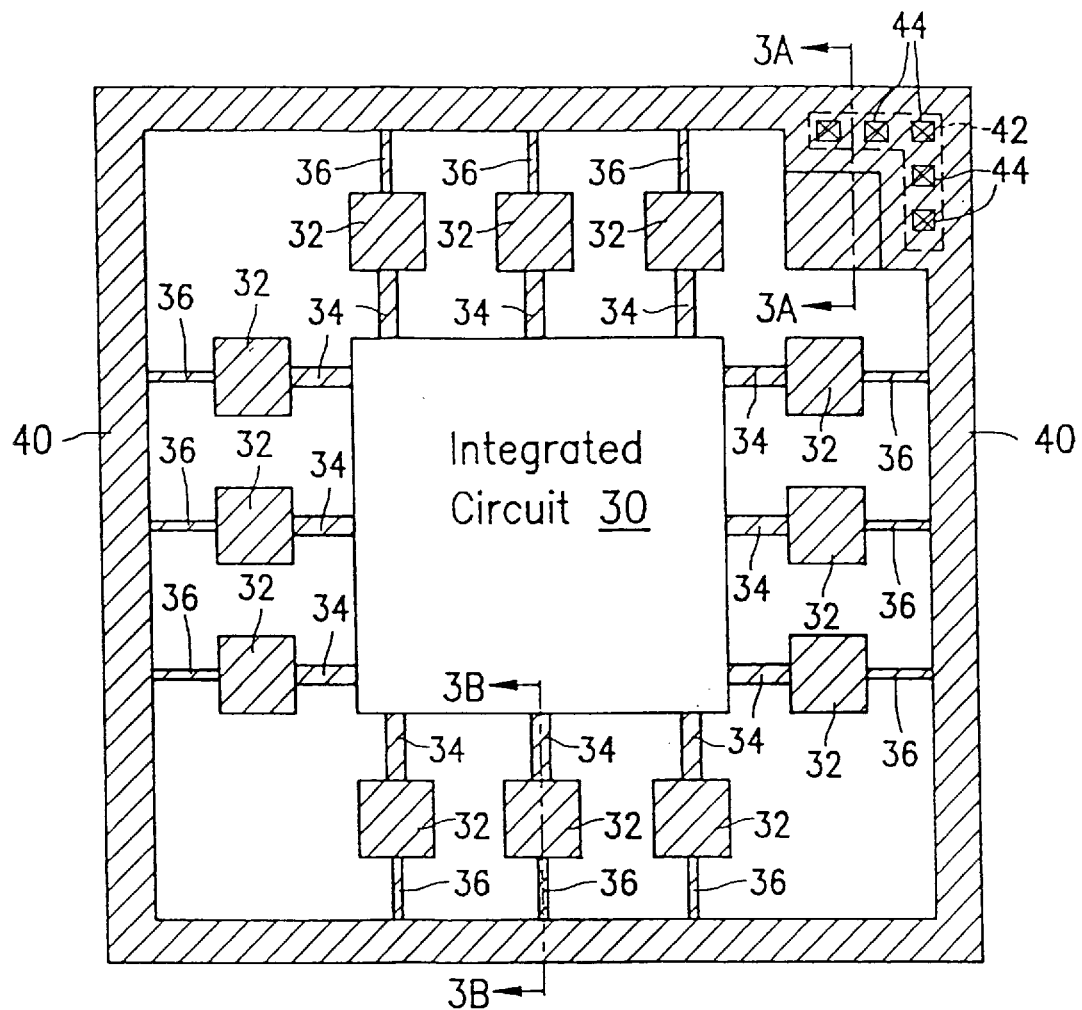
FIG. 2 illustrates a schematic diagram of an integrated circuit layout according to the process of the present invention for eliminating the antenna effect by using grounded dummy metal lines which are connected to the large contact pads respectively.

Referring now to FIG. 2, there is shown a new layout design for an integrated circuit (IC) 30 in a silicon substrate according to one preferred embodiment of the present invention, wherein there is a power rail 40, a power pad area 38, and large contact pad areas 32 at the periphery of the integrated circuit 32. The power rail 40 is connected directly to the power pad area 38 and to a diffusion region 42 in the silicon substrate through contacts 44. The power pad area 38 connects to the power pin $V_{DD}$ or $V_{SS}$ of the finished IC chip. Each contact pad area 32 is connected to the integrated circuit 30 via an interconnection line 34 and to the power rail 40 via a dummy line 36. All of the interconnection lines 34, contact pads 32, dummy lines 36, power rail 40, power pad 38, and contacts 44 can be formed by metal I.

According to this layout design, any charge accumulated during plasma processing steps on the conductive layers, particularly on the large contact pad areas 32, can be discharged to the grounded silicon substrate via a direct electrical connection path from the contact pad areas 32, dummy lines 36, power rail 40, and contacts 44 to the diffusion region 42. This method, thus, effectively and completely eliminates the antenna effect. After the integrated circuit is finished and before testing, an appropriate voltage can be applied alternately across each one of the contact pads 32 and the power pad 38 to burn out the dummy lines 36. Then, the functioning of the integrated circuit is retrieved without any extra IC processing steps. In order to make sure that the dummy lines 36 can be burned out without damaging any other interconnections, the dummy lines 36 are preferably formed sufficiently narrower than other interconnections.

Figure 3A:
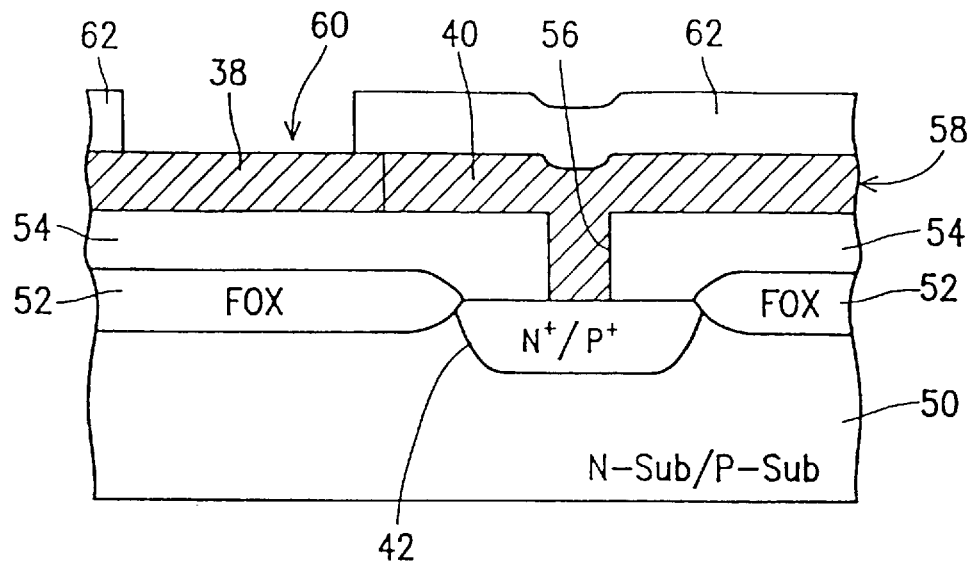
FIG. 3A illustrates a cross-sectional representation of a power pad area, taken along the line 3A—3A shown in FIG. 2.
Figure 3B:
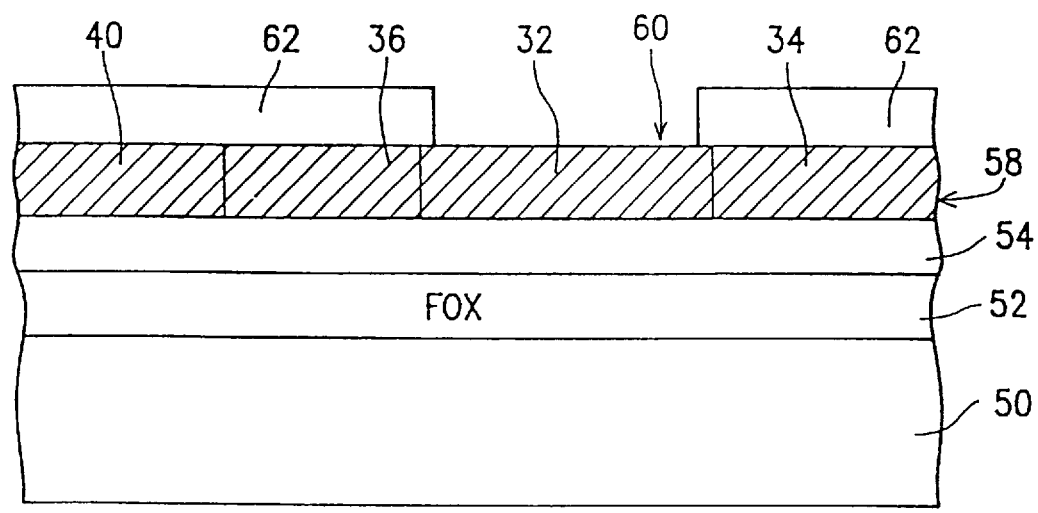
FIG. 3B illustrates a cross-sectional representation of a contact pad area with a grounded dummy metal line, taken along the line 3B—3B shown in FIG. 2.

Referring now to FIGS. 3A and 3B. FIG. 3A shows a cross-sectional representation of the structures of the power pad 38, power rail 40, and diffusion region 42, taken along the line 3A—3A shown in FIG. 2, and FIG. 3B shows a cross-sectional representation of the structures of the power rail 40, dummy line 36, contact pad 32, and interconnection line 34, taken along the line 3B—3B shown in FIG. 2. Field oxide (FOX) 52 is thermally grown on the substrate 50, and the diffusion region 42 is formed in the substrate 50. BPSG (borophosilicate) insulating layer 54 is deposited and patterned on the field oxide 52 to form contact vias 56 above the diffusion region 42. A layer of metal 58 is deposited and patterned to form the power rail 40, power pad 38, dummy lines 36, contact pads 32, and interconnection lines 34. The power rail 40 is connected to the diffusion region 42 through the contact vias 56. Subsequent plasma processing steps may be completed without accumulating charge and causing the antenna effect because the metal layer 58 is grounded to the substrate 50 in this situation. Pad openings 60 are patterned through a passivation layer 62. The burning out process for the dummy lines 36 can be then performed by applying an appropriate voltage alternately across each one of the contact pads 32 and the power pad 38 in order to retrieve the functioning of the integrated circuit. It should be understood by those skilled in the art that this method can be also applied to multi-level metal technology.

Figure 4A:
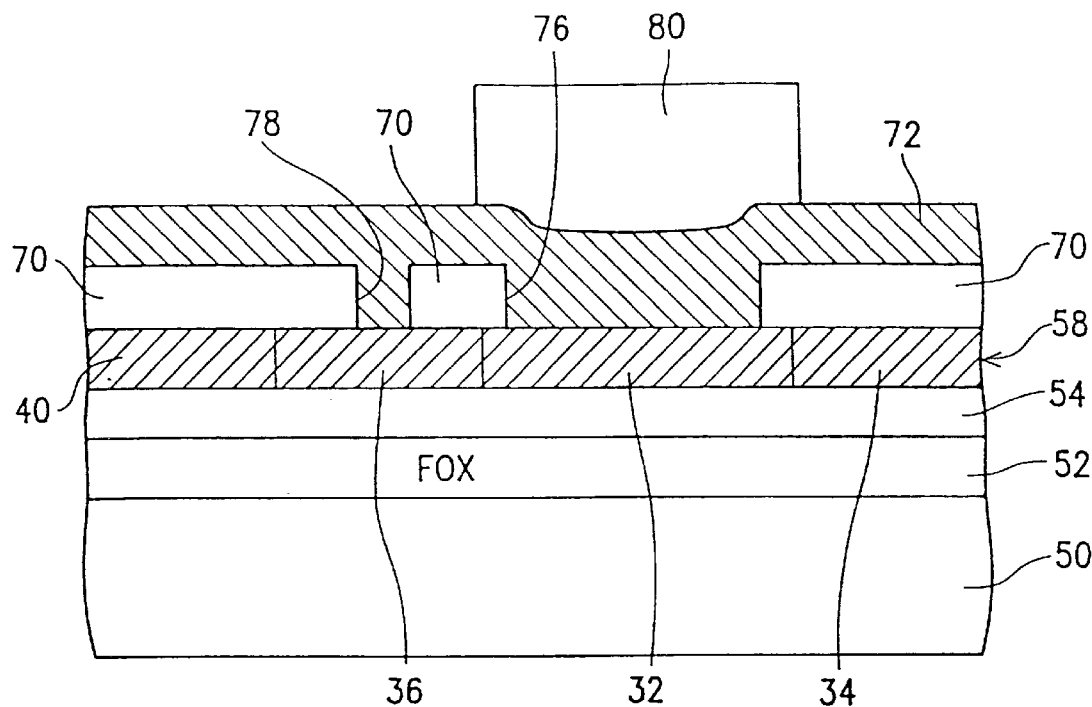
FIGS. 4A and 4B illustrate a further embodiment of the present invention for cutting off the dummy metal lines after plasma processing steps are finished.
Figure 4B:
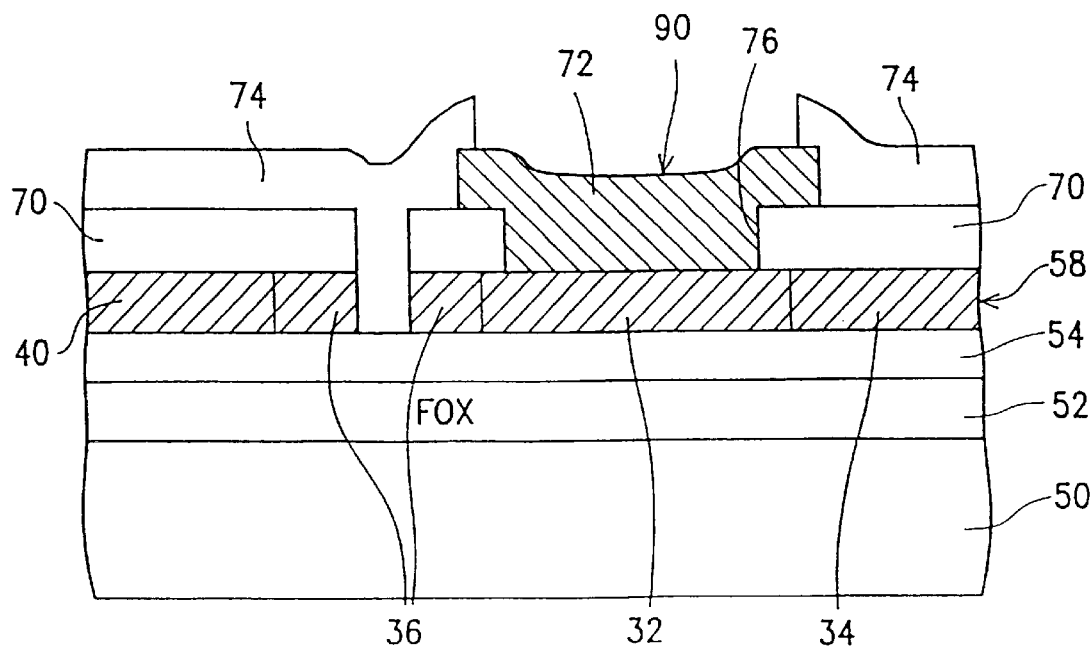

Referring now to FIGS. 4A and 4B, there is shown in cross section another embodiment of the present invention for disconnecting the dummy lines 36 with the power rail 40 in a double metal process after plasma processing steps are finished. Referring first to FIG. 4A, field oxide (FOX) 52 is thermally grown on the substrate 50, and the BPSG (borophosilicate) insulating layer 54 is deposited and patterned on the field oxide 52. A first layer of metal 58 is deposited and patterned to form the power rail 40, dummy lines 36, contact pads 32, and interconnection lines 34 as in the above-described embodiment. Subsequent plasma processing steps may be completed without accumulating charge and causing the antenna effect because the first metal layer 58 is grounded to the substrate 50 in this situation. Vias 76 and 78 respectively above the contact pads 32 and dummy lines 36 are patterned through a second insulating layer 70. A second layer of metal 74 is deposited, and a photorestist 80 is formed to cover the pad areas. Then the exposed second metal layer is removed by etching, and the thus-exposed dummy metal lines 36 through the vias 78 is also etched away to disconnect the contact pads 32 from the power rail 40, as shown in FIG. 4B. In this way, the functioning of the integrated circuit is retrieved without any extra processing steps. The second metal layer 72 in the pad areas is connected to the first metal layer 58 through the vias 76 to finish the eventual contact pads. After the photoresist 80 is stripped, a passivation layer 74 is deposited and patterned to form pad openings 90. It should be understood by those skilled in the art that this method can be also applied to triple- or greater multi-level metal technology.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

I claim:

1. A method for eliminating the antenna effect in the manufacture of an integrated circuit in a silicon substrate, wherein there are contact pad areas at the periphery of the integrated circuit and interconnection lines connecting the contact pad areas with the integrated circuit, comprising:

(a) grounding the contact pad areas to the silicon substrate;

(b) processing in a plasma environment that would normally produce electrical charge build-up at the gate oxide of the integrated circuit, but wherein the grounded contact pad areas eliminate the charge build-up; and (c) disabling the grounding of the contact pad areas to retrieve the functioning of the integrated circuit;

wherein the step (a) includes the steps of:

forming a diffusion region in the silicon substrate;

forming an insulation layer on the silicon substrate with at least one opening to the diffusion region; and depositing and patterning a first layer of metal on the insulating layer to form the contact pad areas, the interconnection lines, a power rail connected to the diffusion region through the opening in the insulating layer, a power pad area connected to the power rail, and dummy lines respectively connecting the contact pad areas with the power rail, thereby grounding the contact pad areas to the silicon substrate via the dummy lines, power rail and diffusion region.

2. The method as claimed in claim 1, wherein the step (c) includes the step of applying a voltage alternately across each one of the contact pad areas and the power pad area to burn out the dummy lines so that the contact pad areas are disconnected from the power rail.

3. The method as claimed in claim 1, wherein the step (c) includes the steps of:

forming a second insulating layer on the first metal layer with openings to the contact pad areas and dummy lines;

depositing a second layer of metal on the second insulating layer such that the second metal layer is connected to the contact pad areas and dummy lines through the openings in the second insulating layer;

forming a resist material over the contact pad areas;

removing the uncovered second metal layer, and then removing the uncovered dummy lines in order to disconnect the contact pad areas from the power rail; and removing the resist material, thereby the residual second metal layer with the first metal layer in the contact pad areas forms the eventual contact pads of the integrated circuit.

4. The method as claimed in claim 1, wherein the processing in a plasma environment is plasma enhanced chemical vapor deposition.

5. The method as claimed in claim 1, wherein the processing in a plasma environment is plasma etching.

6. The method as claimed in claim 5, wherein the plasma etching is a sputter etch.

* * * * *